United States Patent [19]

Noda et al.

[11] 4,191,894

[45] Mar. 4, 1980

[54] PROXIMITY DETECTOR

[75] Inventors: Masahiro Noda; Kazuo Tokui, both of Inazawa, Japan

[73] Assignee: Mitsubishi Denki Kabushiki Kaisha, Tokyo, Japan

[21] Appl. No.: 852,835

[22] Filed: Nov. 18, 1977

[30] Foreign Application Priority Data

Nov. 18, 1976 [JP] Japan .................................. 51-138756

[51] Int. Cl.$^2$ ........................................... H01H 36/00
[52] U.S. Cl. ..................................... 307/116; 307/130; 328/5
[58] Field of Search ................ 307/116, 308, 326, 97, 307/125, 130; 343/5 PD, 16 M; 328/5, 7

[56] References Cited

U.S. PATENT DOCUMENTS

| | | | |
|---|---|---|---|
| 2,720,284 | 10/1955 | Galanty | 187/48 |
| 3,194,975 | 7/1965 | Diamond | 328/5 |
| 3,510,677 | 5/1970 | Lister | 307/116 |
| 4,013,899 | 3/1977 | Guicheteau | 307/308 |

Primary Examiner—L. T. Hix
Assistant Examiner—S. D. Schreyer
Attorney, Agent, or Firm—Oblon, Fisher, Spivak, McClelland & Maier

[57] ABSTRACT

A proximity detector including a pair of antennae disposed at the front edge of a door with a space; and voltage converters for converting earth electrostatic capacities of the antennae to the corresponding voltages. The proximity detector further includes a first detecting circuit for detecting a differential signal of the outputs of the voltage converters; and a second detecting circuit for detecting a summing signal of the outputs of the voltage converters. The movement of the door is controlled by the output of the first detecting circuit and/or the output of the second detecting circuit.

2 Claims, 2 Drawing Figures

PROXIMITY DETECTOR

BACKGROUND OF THE INVENTION

1. Field of the Invention

The present invention relates to a proximity detector for detecting the proximity of a substrate by a change of electrostatic capacity.

2. Description of the Prior Arts

A proximity detector is disposed at the front edge of a door such as an elevator so as to detect an obstacle, in the way of movement of the door during the time of shutting the door or at the full opening of the door under a non-contact condition whereby the movement of the door is reversed or the operation of the movement of the door is stopped.

The conventional proximity detector has the structure shown in FIG. 1.

In FIG. 1, the reference numerals (1) and (2) respectively designate antennae disposed at the front side of the door and (3) and (4 respectively designate earth electrostatic capacities of the antennae (1), (2); (5) designates a shield plate which is insulated from the antennae (1), (2); (6) and (7) respectively designate electrostatic capacities between the antennae (1), (2) and the shield plates (5). The electrostatic capacities (3), (4), (6), (7) form an impedance bridge. The reference numeral (8) designates a AC power source; (9) designates a transformer for detecting the unbalance of the bridge; (10) designates an AC amplification circuit for amplifying the unbalanced voltage of the bridge applied to the transformer (9). The reference numeral (11) designates a rectifying circuit; (12) designates a DC amplification circuit for amplifying the output of the rectifying circuit (11); (13) designates an output relay; (14) designates an antenna cover for protecting the antennae (1), (2) disposed at the front side of the door and D designates a non-sensitive part.

Normally, the bridge circuit is balanced to zero the output of the transformer (9). When a body or a substrate approaches the antenna (1), only the earth electrostatic capacity (3) of the antenna (1) is changed whereby the impedance bridge becomes unbalanced and an output voltage which is proportional to the unbalanced value is produced in the transformer (9). The output is amplified by the AC amplification circuit (10) and it is converted to DC current by the rectifying circuit (11) and the output is amplified by the DC amplification circuit (12) to drive the relay (13). The relay (13) stops the movement of shutting the door or reverses movement of the door so as to prevent the catching of a body or a substrate in the door.

In the conventional proximity detector having the bridge structure, changes in the electrostatic capacities in the same phase mode for both of the electrostatic capacities (3), (4) of the antennas (1), (2) cancel each other in the bridge circuit, whereby the erroneous operation caused by the swinging of the door during the operation of shutting the door can be eliminated and high detecting sensitivity can be attained. On the other hand, when one's hand is caused to touch the antenna cover (14) at the full opening condition of the door to prevent the initiation of the shutting operation of the door, the following disadvantages are caused.

(a) When one's hand is caused to touch the antenna cover (14) at the nonsensitive zone D in the boundary between the antenna (1) and the antenna (2), the bridge is balanced so as not to generate the bridge output whereby the shutting operation of the door cannot be prevented.

(b) When the hand of one person is caused to touch the antenna cover (14) over the antenna (1), and a hand of another person is caused to touch the antenna cover (14) over the antenna (2), the bridge is balanced whereby the shutting operation of the door cannot be prevented.

In order to eliminate the non-sensitive zone D causing the above-mentioned trouble, it can be considered that the antennas (1), (2) are further divided to form a plurality of bridge circuits by combining the divided antennae. However, the structure of such a device is complicated.

It is difficult to overcome the disadvantages of (2) by the modification of the bridge structure in principle.

SUMMARY OF THE INVENTION

It is an object of the present invention to improve the above-mentioned disadvantage and to provide a proximity detector having a simple structure and high stability without impairing the high detecting sensitivity produced by the bridge structure.

The foregoing and other objects of the present invention have been attained by providing a proximity detector comprising a pair of antennas disposed at the front edge of a door with a space; and voltage converters for converting earth electrostatic capacities of the antennas to the corresponding voltages. The low proximity detector further includes a first detecting circuit for detecting a differential signal of the outputs of the voltage converters; and a second detecting circuit for detecting a summing signal of the outputs of the voltage converters. The movement of the door is controlled by the output of the first detecting circuit and/or the output of the second detecting circuit.

DETAILED DESCRIPTION OF THE PREFERRED EMBODIMENTS

A preferred embodiment of the present invention will be described by referring to FIG. 2.

Figure 1:
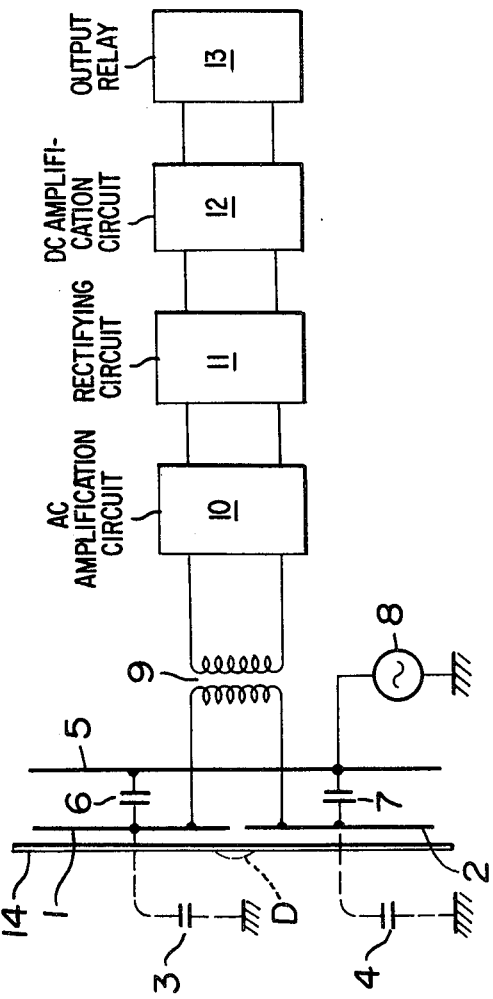
FIG. 1 is a block circuit diagram of the conventional proximity detector.
Figure 2:
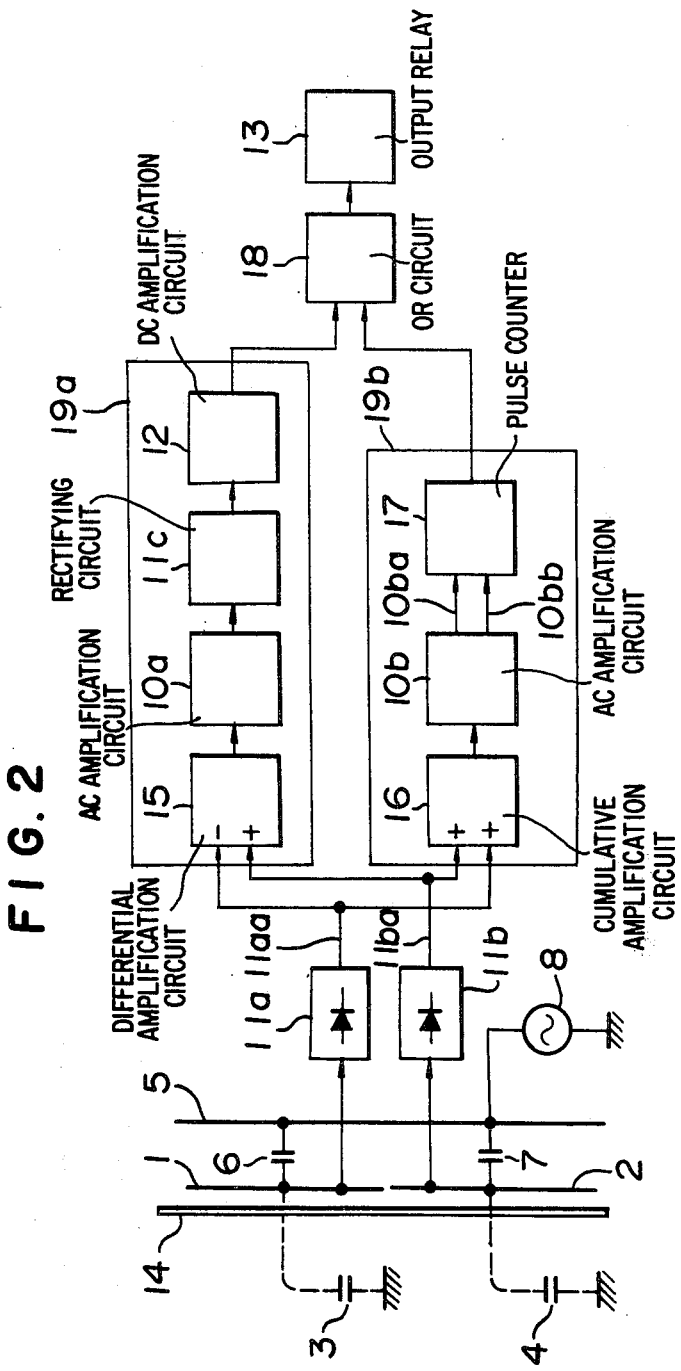
FIG. 2 is a block circuit diagram of one embodiment of a proximity detector according to the present invention.

In FIG. 2, the reference numerals (10a), (10b) respectively designate AC amplification circuits; (11a) to (11c) respectively designates rectifying circuits; (12) designates DC amplification circuit; (13) designates an output relay; (15) designates a differential amplification circuit; (16) designates a cumulative amplification circuit; (17) designates a pulse counter; (18) designates an OR circuit; (19a) designates a first detecting circuit; and (19b) designates a second detecting circuit.

An AC voltage given by shunting the voltage of the AC power source (8) by the electrostatic capacity (6) and the earth electrostatic capacity (3) of the antenna (1), is applied to the antenna (1). The AC voltage is rectified by the rectifying circuit (11a) to obtain the DC voltage (11aa). On the other hand, the AC voltage given by shunting the voltage of the AC power source (8) by the electrostatic capacity (7) and the earth electrostatic capacity (4) of the antenna (2), is applied to the antenna (2). The AC voltage is rectified by the rectifying circuit (11b) to obtain the DC voltage (11ba).

The DC voltages (11aa) (11ba) given by the rectifying circuits (11a), (11b) are subtracted and amplified by the differential amplification circuit (15) of the first detecting circuit (19a). The antenna (1) and the antenna (2) form a bridge from the viewpoint of the output of the differential amplification circuit (15).

The output of the differential amplification circuit (15) is zero in the case of the equation:
electrostatic capacity (3)×electrostatic capacity (7)=electrostatic capacity (4)×electrostatic capacity (6).

When the output of the differential amplifier circuit (15) has been changed in the positive direction by an increase in the earth electrostatic capacity (3) of the antenna (1) caused by proximity of a substrate to the antenna (1), the output of the differential amplification circuit (15) can be changed in the negative direction by proximity of a substrate to the antenna (2).

It is difficult to always maintain the balance of the electrostatic capacities (3), (4), (6), (7) because of variations of ambient temperature and humidity and adhesion of dust on the antenna cover (14), whereby the output of the differential amplification circuit (15) is not kept zero and it is not always constant.

In general, the change of the output of the differential amplification circuit (15) caused by the ambient temperature has a longer period in comparison with the change of the output of the differential amplification circuit (15) caused by proximity of a substrate to the antennas (1), (2). Accordingly, only the change of the output of the differential amplification circuit (15) caused by proximity of a substrate to the antennas (1), (2) is selectively amplified by the next AC amplification circuit (10a), whereby the effect of the ambient temperature is eliminated.

The polarity of the output of the AC amplification circuit (10a) caused by proximity of a substrate to the antenna (1) is different from that of proximity of a substrate to the antenna (2). Accordingly, it is rectified as the full-wave rectification by the next rectifying circuit (11c) and amplified by the DC amplification circuit (12) and passed through the OR circuit (18) to drive the relay (13).

The first detecting circuit (19a) attains non-contact detection of high sensitivity higher than that of the conventional proximity detector, by the combination of the differential amplification circuit (15), the AC amplification circuit (10a), the rectifying circuit (11c) and the DC amplification circuit (12). On the other hand, in the cumulative (summing) amplification circuit (16) of the second detecting circuit (19b), the DC voltages (11aa), (11ba) obtained by the rectifying circuits (11a), (11b) are summed and amplified. The output of the cumulative amplification circuit (16) is decreased depending upon the increase of the earth electrostatic capacities (3), (4) of the antenna (1) and the antenna (2), and it is increased depending upon the decrease of the earth electrostatic capacities (3), (4) of the antenna (1) and the antenna (2). Accordingly, the antennae (1), (2) are considered to form one antenna from the viewpoint of the output of the cumulative amplification circuit (16).

In the case of a single antenna structure, the output of the cumulative amplification circuit (16) is changed because it is easily affected by the swinging of a door during the operation of shutting the door and the change of the earth electrostatic capacities (3), (4) of the antennas (1), (2) caused by the variation of ambient temperature and humidity. Accordingly, it is difficult to detect, with high sensitivity, the variations of the earth electrostatic capacities (3), (4) of the antennae (1), (2) from the output of the cumulative amplification circuit (16).

In the second detecting circuit (19b), only large changes in the earth electrostatic capacities of the antennas (1), (2) that is, the operation of touching or disengaging a hand from the antenna cover (14) is detected.

When a large change of the output of the cumulative amplification circuit (16) is given, for example, a hand is caused to touch the antenna cover (14), a touch pulse signal (10ba) is generated as the output of the AC amplification circuit (10b). When a hand is caused to disengage from the antenna cover (14), the disengage pulse signal (10bb) is generated as the output of the AC amplification circuit (10b).

The pulse counter (17) is usually set to zero for the datum. The pulse counter (17) is counted up by the touch pulse signal (10ba) of the AC amplification circuit (10b) to record the touching of the antenna cover (14). The output of the pulse counter (17) is passed through the OR circuit (18) to drive the relay (13).

When the pulse counter (17) is counted down to zero by the disengage pulse signal (10bb) of the AC amplification circuit (10b), the driving of the relay (13) by the output of the pulse counter (17) is stopped as there is no touching of the antenna cover (14). When a plurality of hands touch on the antenna cover (14), the driving of the relay (13) is continued until disengaging of the same number of hands occurs.

The relay (13) is driven by the logical sum of the highly sensitive detection by the first detecting circuit (19a) and the touch detection on the antenna cover (14) by the second detecting circuit (19b), whereby the door shutting operation is stopped or reversed so as to prevent the catching of a body or a substance in a door.

In the above-mentioned embodiment, there has been described the combination of only the electrostatic capacities as to convert the change of the earth electrostatic capacities (3), (4) of the antennas (1), (2) to a voltage variation. Thus, it is clear that the present invention can be applied to the case of converting the change of the earth electrostatic capacities (3), (4) of the antennas (1), (2) to the voltage variation by a other circuit systems.

In the above-mentioned embodiment, there has been described conversion of the the voltages given to the antennas (1), (2) to DC voltages by rectification. Thus, it is clear that the present invention can be applied to the case of applying the voltages given to the antennas (1), (2) directly to the differential amplification circuit (15) and the cumulative amplification circuit (16).

As described above, in accordance with the present invention, the earth electrostatic capacities of the divided antennas are respectively converted to corresponding voltages and the proximity of a substrate is detected by both a summing signal and the a subtracting signal. High sensitivity detection higher than that of the conventional bridge system can be attained and the non-sensitive zone to touching of the antenna cover can be eliminated and the erroneous operation caused by a plurality of touches on the antenna cover can be prevented. When the present invention is applied to an electric automatic door, the safety factor can be further improved.

What is claimed is:

1. A proximity detector adapted for opening of a door which comprises:
   a pair of antennas disposed at the front edge of a door with a space;
   means for converting earth electrostatic capacities of the antennas to corresponding voltages;
   a first detecting circuit for detecting a differential signal of the outputs of the converting means;
   a second detecting circuit for detecting a summing signal of the outputs of the converting means; and
   means for responding to the output of the first, or second, detecting circuits for control of the operation of the door,
   wherein the second detecting circuit includes a pulse counter to count up by a touch pulse signal and to count down by a disengage pulse signal and an operation of the door is controlled by an output of the pulse counter.

2. A proximity detector adapted for opening of a door which comprises:
   a pair of antennas disposed at the front edge of a door with a space;
   means for converting earth electrostatic capacities of the antennas to corresponding voltage;
   a first detecting circuit for detecting a differential signal of the outputs of the converting means;
   a second detecting circuit for detecting a summing signal of the outputs of the converting means; and
   means for responding to the output of the first, or second, detecting circuits for control of the operation of the door,
   wherein the pair of antennas are used as a bridge during closing of the door and as one antenna during full opening of the door.

* * * * *